United States Patent
Cheng et al.

(10) Patent No.: US 10,665,370 B2
(45) Date of Patent: May 26, 2020

(54) CO-WOUND RESISTOR

(71) Applicant: QUALCOMM Incorporated, San Diego, CA (US)

(72) Inventors: Haitao Cheng, San Diego, CA (US); Chao Song, San Diego, CA (US); Ye Lu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 13 days.

(21) Appl. No.: 16/058,928

(22) Filed: Aug. 8, 2018

(65) Prior Publication Data

US 2020/0051718 A1    Feb. 13, 2020

(51) Int. Cl.
| | |
|---|---|
| *H01C 3/02* | (2006.01) |
| *H01L 49/02* | (2006.01) |
| *H01L 27/02* | (2006.01) |
| *H01C 17/04* | (2006.01) |
| *H01C 3/16* | (2006.01) |
| *G06F 30/36* | (2020.01) |
| *G06F 30/3312* | (2020.01) |

(52) U.S. Cl.
CPC .......... *H01C 3/02* (2013.01); *G06F 30/3312* (2020.01); *G06F 30/36* (2020.01); *H01C 3/16* (2013.01); *H01C 17/04* (2013.01); *H01L 27/0207* (2013.01); *H01L 28/24* (2013.01)

(58) Field of Classification Search
CPC ......... H01C 3/02; H01C 3/16; G06F 17/5031; G06F 17/5063
USPC ........................................................... 338/62
See application file for complete search history.

(56) References Cited

U.S. PATENT DOCUMENTS

| | | | |
|---|---|---|---|
| 5,661,450 A | 8/1997 | Davidson | |
| 6,440,318 B1 * | 8/2002 | Lee ................ | H05K 1/167 174/260 |
| 6,927,664 B2 | 8/2005 | Nakatani et al. | |
| 2004/0196136 A1 | 10/2004 | Yang | |
| 2015/0302976 A1 | 10/2015 | Chang et al. | |

\* cited by examiner

*Primary Examiner* — Kyung S Lee
*Assistant Examiner* — Iman Malakooti
(74) *Attorney, Agent, or Firm* — Seyfarth Shaw LLP

(57) ABSTRACT

A co-wound resistor with a low parasitic inductance includes a first resistive strip having an input and a second resistive strip having an output. The second resistive strip has a similar shape as the first resistive strip. The second resistive strip is co-wound in a same direction as the first resistive strip. The second resistive strip and the first resistive strip are configured to generate a mutual inductance that cancels an inductance of the first resistive strip and the second resistive strip. The first interconnect coupling the first resistive strip to the second resistive strip. The first resistive strip, the second resistive strip and the first interconnect are on a same level.

20 Claims, 10 Drawing Sheets

CO-WOUND RESISTOR

BACKGROUND

Field

Aspects of the present disclosure relate to radio frequency integrated circuits and, more particularly, to co-wound metal/polysilicon resistors for low parasitic inductance.

Background

Mobile radio frequency (RF) chips (e.g., mobile RF transceivers) have migrated to a deep sub-micron process node due to cost and power consumption considerations. Designing such mobile RF transceivers becomes complex at this deep sub-micron process node. Designing these mobile RF transceivers is further complicated by added circuit functions for supporting communications enhancements, such as fifth generation (5G) communications. Further design challenges for mobile RF transceivers include analog/RF performance considerations, including mismatch, noise, and other performance considerations. Designs of these mobile RF transceivers may include additional passive devices (e.g., resistors), for example, for biasing and suppressing resonance, and/or for performing filtering, bypassing, and coupling.

Resistors may include a metal material that exhibits good resistor properties, such as stability and ease of processing. These metal materials, however, may be limited to low sheet resistance. The low sheet resistance of the material means that the resistor material occupies a large area on a chip to meet the resistor specifications. As a result, these resistors pose several problems including high parasitic series inductance, which degrades the resistor's performance (especially in high frequency applications). Therefore, it is desirable to have a resistor with a low parasitic inductance.

SUMMARY

A co-wound resistor includes a first resistive strip having an input. The co-wound resistor also includes a second resistive strip having an output and a similar shape as the first resistive strip. The second resistive strip is co-wound in a same direction as the first resistive strip. The second resistive strip and the first resistive strip are configured to generate a mutual inductance that cancels an inductance of the first resistive strip and the second resistive strip. The co-wound resistor also includes a first interconnect that couples the first resistive strip to the second resistive strip. The first resistive strip, the second resistive strip and the first interconnect are on a same level.

A method of making a co-wound resistor includes fabricating a first resistive strip having an input. The method also included fabricating a second resistive strip having an output and a similar shape as the first resistive strip. The second resistive strip is co-wound in a same direction as the first resistive strip. The second resistive strip and the first resistive strip are configured to generate a mutual inductance that cancels an inductance of the first resistive strip and the second resistive strip. The method further includes fabricating an interconnect that couples the first resistive strip to the second resistive strip. The first resistive strip, the second resistive strip and the interconnect are on a same level.

A co-wound resistor includes first means for generating resistance having an input. The co-wound resistor also includes second means for generating resistance having an output and a similar shape as the first resistance generating means. The second resistance generating means is co-wound in a same direction as the first resistance generating means. The second resistance generating means and the first resistance generating means are configured to generate a mutual inductance that cancels an inductance of the first resistance generating means and the second resistance generating means. The co-wound resistor also includes a first interconnect that couples the first resistance generating means to the second resistance generating means. The first resistance generating means, the second resistance generating means and the first interconnect are on a same level.

Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
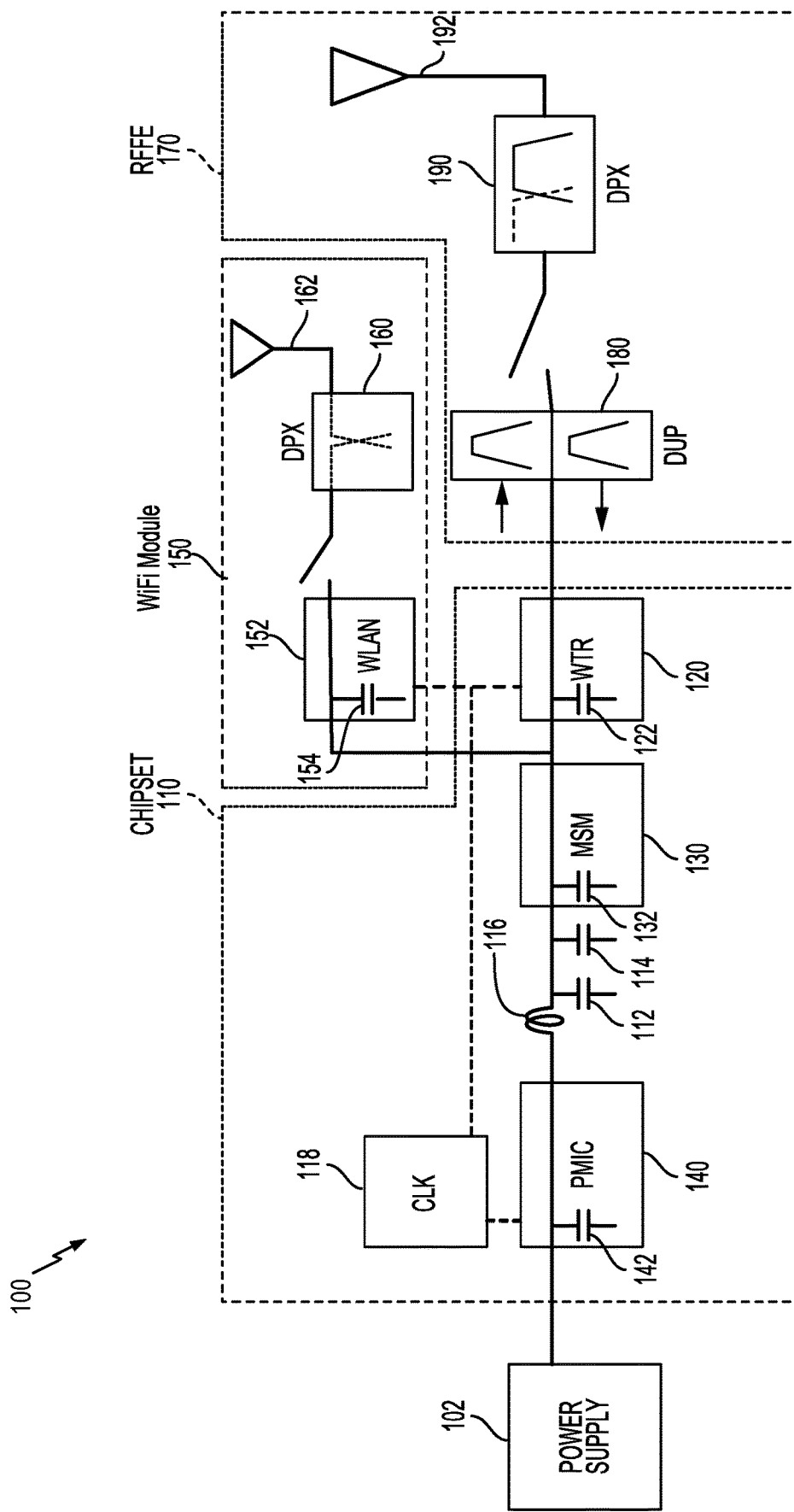
FIG. 1 is a schematic diagram of a radio frequency (RF) front-end module.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Resistors may include a metal material that exhibits good resistor properties, such as stability and ease of processing. These metal materials, however, may be limited to low sheet resistance. The low sheet resistance of the material means that the resistor material occupies a large area on a chip to meet the resistor specifications. As a result, these resistors pose several problems including high parasitic series inductance, which degrades the resistor's performance (especially in high frequency applications). Therefore, it is desirable to have a resistor with a low parasitic inductance.

Various aspects of the present disclosure provide techniques for fabricating a co-wound resistor with low parasitic inductance.

In some aspects, the process flow for fabrication of the co-wound resistor may include front-end-of-line (FEOL) processes, middle-of-line (MOL) processes, and back-end-of-line (BEOL) processes. Access to active devices, formed during a front-end-of-line process, is conventionally provided during middle-of-line processing that provides contacts between the gates and source/drain regions of the active devices and back-end-of-line interconnect layers or levels (e.g., M1, M2, etc.). It will be understood that the term "layer" or "level" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms "chip" and "die" may be used interchangeably.

According to aspects of the present disclosure, the co-wound resistor includes a first resistive strip having an input terminal, a second resistive strip having an output terminal, and a first interconnect coupling the first resistive strip to the second resistive strip. The second resistive strip has a similar shape as the first resistive strip. The second resistive strip is co-wound with the first resistive strip. For example, the second resistive strip is co-wound in a same direction as the first resistive strip to generate a mutual inductance that cancels an inductance of the first and second resistive strips.

The first resistive strip, the second resistive strip, and the first interconnect are on a same level. The first resistive strip and the second strip may be separated and electrically insulated from each other by a dielectric. The first resistive strip and the second resistive strip are electrically connected with the first interconnect. In one aspect of the disclosure, each of the first resistive strip and the second resistive strip is polysilicon or a conductive material (e.g., metal).

In some aspects, each of the first resistive strip and the second resistive strip includes multiple parallel traces. For example, the first resistive strip includes a first node and a second node where multiple traces are in parallel between the first node and the second node. Similarly, the second resistive strip includes a third node and a fourth node where multiple traces are in parallel between the third node and the fourth node.

The co-wound resistor may also include a third resistive strip (e.g., similar to the first resistive strip) and a fourth resistive strip (e.g., similar to the second resistive strip) coupled by a second interconnect. The third resistive strip, the fourth resistive strip, and the second interconnect are on a different level than the first and second resistive strips. A third interconnect (e.g., a via) connects the third and fourth resistive strips to the first and second resistive strips.

In one aspect, the first and second resistive strips are polysilicon and the third, and fourth resistive strips are metal. In other aspects, each of the first, second, third, and fourth resistive strips is metal. In some implementations, each of the first and second resistive strips has multiple layers, in which the different layers are connected by one or more vias. Each of the first and second resistive strips are shaped in a non-spiral configuration. For example, each of the first and second resistive strips are shaped in accordance with a twist/crossing configuration, straight line configuration, or a meandering configuration.

FIG. 1 is a schematic diagram of a wireless device 100 (e.g., a cellular phone or a smartphone) having a co-wound resistor, according to aspects of the present disclosure. The wireless device 100 may include a wireless local area network (WLAN) (e.g., WiFi) module 150 and a RF front-end module 170 for a chipset 110. The WiFi module 150 includes a first diplexer 160 communicably coupling an antenna 162 to a wireless local area network module (e.g., WLAN module 152). The RF front-end module 170 includes a second diplexer 190 communicably coupling an antenna 192 to the wireless transceiver 120 (WTR) through a duplexer 180 (DUP).

The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The wireless transceiver 120 of the wireless device generally includes a mobile RF transceiver to transmit and receive data for two-way communications. A mobile RF transceiver may include a transmit section for data transmission and a receive section for data reception. For data transmission, the transmit section may modulate a RF carrier signal with data to obtain a modulated RF signal, amplify the modulated RF signal using a power amplifier (PA) to obtain an amplified RF signal having the proper output power level, and transmit the amplified RF signal via the antenna 192 to a base station. For data reception, the receive section may obtain a received RF signal via the antenna 192 and may amplify the received RF signal using a low noise amplifier (LNA) and process the received RF signal to recover data sent by the base station in a communications signal.

The wireless transceiver 120 may include one or more circuits for amplifying these communications signals. The amplifier circuits (e.g., LNA/PA) may include one or more amplifier stages that may have one or more driver stages and one or more amplifier output stages. Each of the amplifier stages includes one or more transistors configured in various ways to amplify the communications signals. Various options exist for fabricating the transistors that are configured to amplify the communications signals transmitted and received by the wireless transceiver 120.

Figure 2:
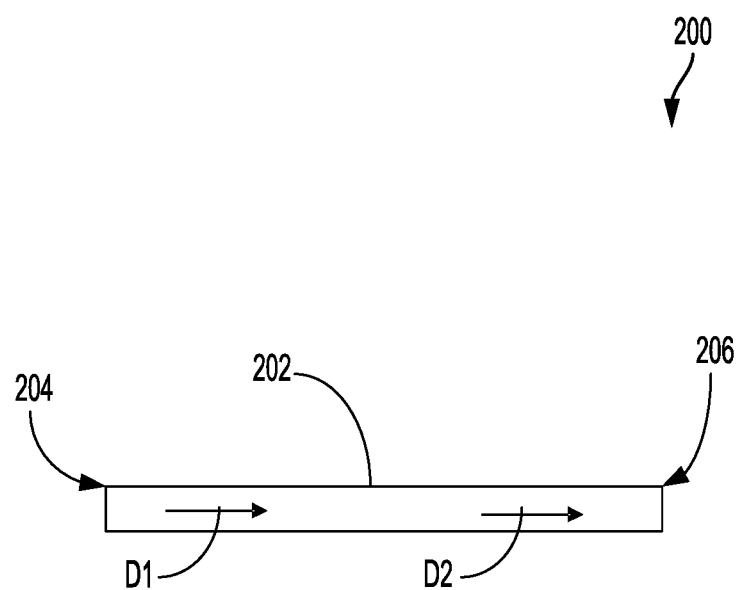
FIG. 2 is a schematic diagram of a conventional resistor.

FIG. 2 is a schematic diagram of a conventional resistor 200. The conventional resistor 200 includes a one layer straight line metal resistor 202. The one layer straight line metal resistor 202 includes an input terminal 204 and an output terminal 206. A signal may flow into the input terminal 204 and exit the output terminal 206, as illustrated by directional arrows D1 and D2. However, the conventional resistor 200 can create high parasitic inductance.

Figure 3A:
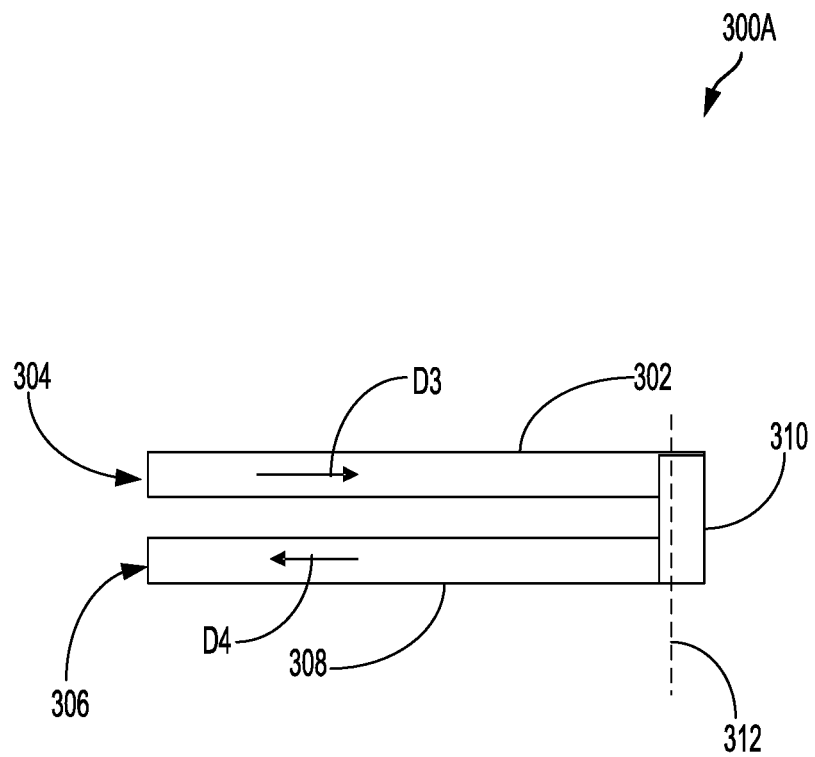
FIG. 3A illustrates a top view of a co-wound resistor for low parasitic inductance, according to aspects of the present disclosure.

FIG. 3A illustrates a top view of a co-wound resistor 300A for low parasitic inductance, according to aspects of the present disclosure. The co-wound resistor 300A includes a first trace or first resistive strip 302 having an input terminal 304, a second resistive strip 308 having an output terminal 306 and a first interconnect 310 coupling the first resistive strip 302 to the second resistive strip 308. A signal may flow into the input terminal 304 and through the first resistive strip 302, as illustrated by directional arrows D3, and exit the output terminal 306 via the second resistive strip 308, as illustrated by directional arrows D4. The second resistive strip 308 has a similar shape as the first resistive strip 302. The second resistive strip 308 is co-wound with the first resistive strip 302. For example, the second resistive strip 308 is co-wound in a same direction as the first resistive strip 302 to generate a mutual inductance that cancels an inductance caused by the first resistive strip 302 and the second resistive strip 308. In one aspect, the inductance caused by a signal flowing through the first resistive strip 302 in the direction D3 is cancelled by an inductance caused by the signal flowing through the second resistive strip 308 in the direction D4 that is opposite the direction D3.

The first resistive strip 302, the second resistive strip 308, and the first interconnect 310 are on a same level or layer (e.g., BEOL layer). The first resistive strip 302 and the second resistive strip 308 may be separated and electrically insulated from each other by a dielectric. The first resistive strip 302 and the second resistive strip 308 are electrically connected with the first interconnect 310. In one aspect of the disclosure, each of the first resistive strip and the second resistive strip is polysilicon. For example, the co-wound resistor 300A may be a polysilicon resistor and may be formed in layers where the active devices are formed below the BEOL layers. In some aspects, the co-wound resistor 300A may be a conductive material (e.g., metal) formed in the BEOL layer(s). Line 312 represents a cross-section from which the illustration of FIG. 3B is based.

Figure 3B:
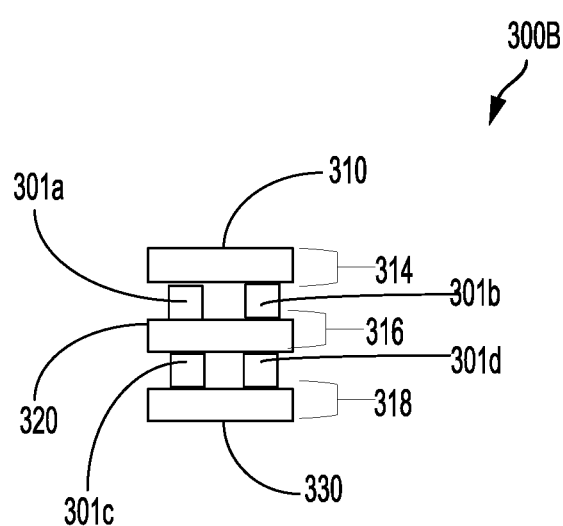
FIG. 3B illustrates a cross-section of a co-wound resistor for low parasitic inductance, according to aspects of the present disclosure.

FIG. 3B illustrates a cross-section of a co-wound resistor 300B for low parasitic inductance, according to aspects of the present disclosure. For illustrative purposes, some of the labelling and numbering of the devices and features of FIG. 3B are similar to those of the FIG. 3A. However, FIG. 3B illustrates that the co-wound resistor 300B includes multiple resistor structures fabricated on multiple layers (e.g., BEOL layers of a semiconductor device or integrated circuit and/or layers where the active devices are formed or layers below the BEOL layers). One of the resistor structures is the co-wound resistor 300A on a first level 314. As noted, the illustration of FIG. 3B is based on a cross-section indicated by line 312 through the first interconnect 310 of the co-wound resistor 300A. This line 312 may be extrapolated to other resistor structures of the co-wound resistor 300B on different levels (e.g., a second level 316 and a third level 318).

In addition to the co-wound resistor 300A (e.g., the first resistor structure of the co-wound resistor 300B that includes the first interconnect 310), the co-wound resistor 300B includes a second resistor structure that has a second interconnect 320 on a second level 316 and a third resistor structure that has a third interconnect 330 on a third level 318. In some aspects, the first level 314, the second level 316, and the third level 318 are BEOL layers of a semiconductor device. In some aspects, the third level 318 may be a layer where the active devices are formed or a layer below the BEOL layers. In some implementations, the first resistor structure, the second resistor structure, and the third resistor structure of the co-wound resistor 300B are all metals. In some implementations, however, the third resistor structure of the co-wound resistor 300B may be polysilicon.

The first resistor structure on the first level 314 may be coupled to the second resistor structure on the second level 316 using vias (e.g., a first via 301a and a second via 301b). The second resistor structure on the second level 316 may be coupled to the third resistor structure on the third level 318 using vias (e.g., a third via 301c and a fourth via 301d).

Figure 4A:
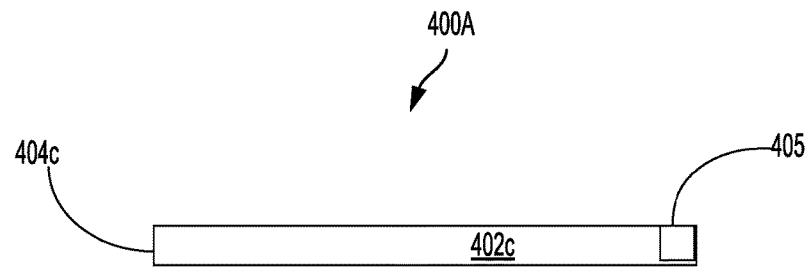
FIGS. 4A and 4B respectively illustrate a top view and a cross-sectional view of a co-wound resistor having a first set of input traces in a first set of layers and a second set of output traces in a second set of layers.
Figure 4B:
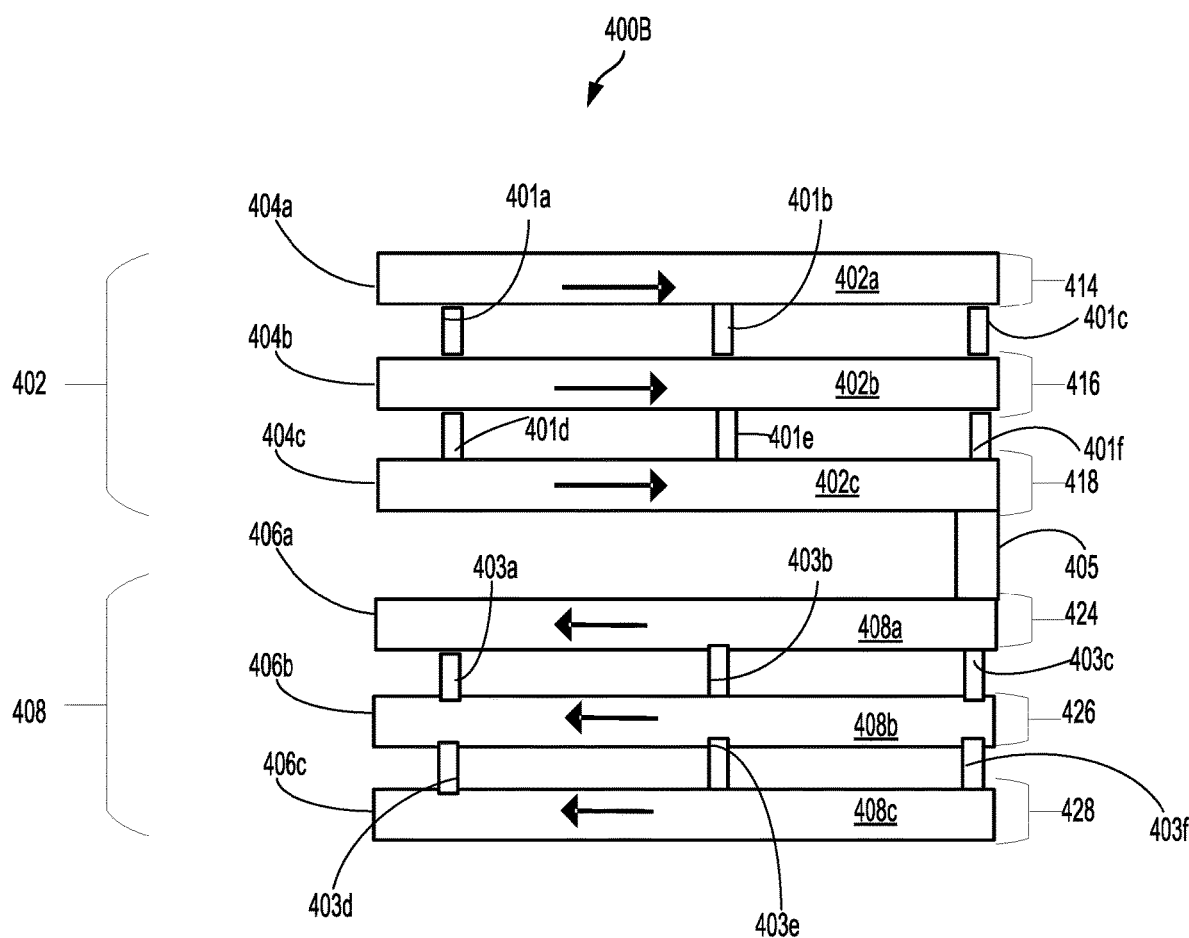

FIGS. 4A and 4B respectively illustrate a top view 400A and a cross-sectional view 400B of a co-wound resistor having a first set of input traces or a first set of resistive strips 402 in a first set of levels and a second set of output traces or second set of resistive strips 408 in a second set of levels. The first set of resistive strips 402 includes a first input trace 402a at a first level 414, a second input trace 402b at a second level 416, and a third input trace 402c at a third level 418. The second set of resistive strips 408 includes a first output trace 408a at a fourth level 424, a second output trace 408b at a fifth level 426, and a third output trace 408c at a sixth level 428.

The first set of resistive strips 402 includes an input terminal of the co-wound resistor and the second set of resistive strips 408 includes an output terminal of the co-wound resistor. For example, the input terminal of the co-wound resistor includes a first input terminal 404a of the first input trace 402a, a second input terminal 404b of the second input trace 402b, and a third input terminal 404c of the third input trace 402c. The output terminal of the co-wound resistor includes a first output terminal 406a of the first output trace 408a, a second output terminal 406b of the second output trace 408b, and a third output terminal 406c of the third output trace 408c.

A common or shared via 405 couples the first set of resistive strips 402 to the second set of resistive strips 408.

Thus, inductance from through the first set of resistive strips 402 is cancelled by inductance from the second set of resistive strips 408.

According to this aspect, the co-wound resistor includes a single strip or trace that forms a resistor structure in each layer. For example, the first level 414 includes the first input trace 402a that forms the resistor structure in the first level 414. Similarly, the sixth level 428 includes the third output trace 408c that forms the resistor structure in the sixth level 428. The traces from the first set of resistive strips 402 are coupled together by a first set of vias. For example, the first input trace 402a is coupled to the second input trace 402b by a first via 401a, a second via 401b, and a third via 401c. Similarly, the third input trace 402c is coupled to the second input trace 402b by a fourth via 401d, a fifth via 401e, and a sixth via 401f.

The traces from the second set of resistive strips 408 are coupled together by a second set of vias. For example, the first output trace 408a is coupled to the second output trace 408b by a seventh via 403a, an eighth via 403b, and a ninth via 403c. Similarly, the third output trace 408c is coupled to the second output trace 408b by a tenth via 403d, an eleventh via 403e, and a twelfth via 403f.

Figure 5:
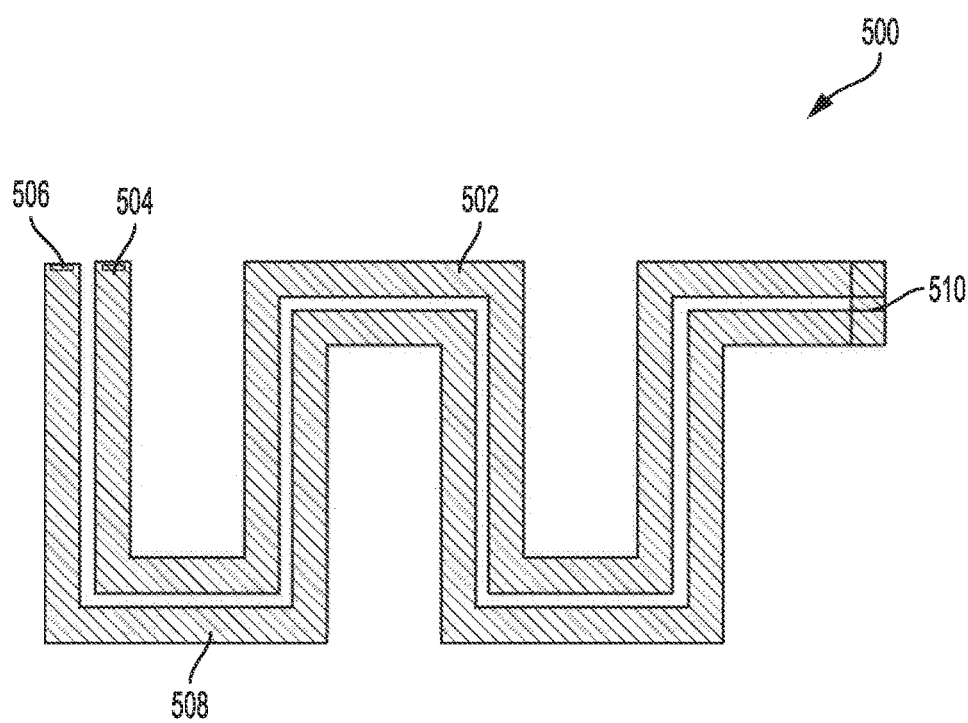
FIG. 5 illustrates a top view of a co-wound resistor having a serpentine shape, according to aspects of the present disclosure.

FIG. 5 illustrates a top view of a co-wound resistor 500 having a serpentine or meandering shape, according to aspects of the present disclosure. The co-wound resistor 500 includes a first resistive strip 502 having an input terminal 504, a second resistive strip 508 having an output terminal 506 and an interconnect 510 coupling the first resistive strip 502 to the second resistive strip 508. The second resistive strip 508 is co-wound with the first resistive strip 502 and has a similar shape as the first resistive strip 502. For example, the second resistive strip 508 is co-wound in a same meandering or serpentine pattern as the first resistive strip 502, while sharing the interconnect 510. As a result, the first resistive strip 502 generates an inductance that cancels an inductance from the second resistive strip 508. In some aspects, the first resistive strip 502, the second resistive strip 508, and the interconnect 510 are on a same level or layer (e.g., BEOL layer).

In one aspect of the disclosure, each of the first resistive strip 502 and the second resistive strip 508 is polysilicon. For example, the co-wound resistor 500 may be a polysilicon resistor and may be formed in layers where the active devices are formed or formed below the BEOL layers. In other aspects, the co-wound resistor 500 may be a conductive material (e.g., metal) formed in the BEOL layer(s). A resistor may be formed with multiple co-wound resistors (e.g., the co-wound resistor 500) in multiple levels that are connected by vias.

Figure 6:
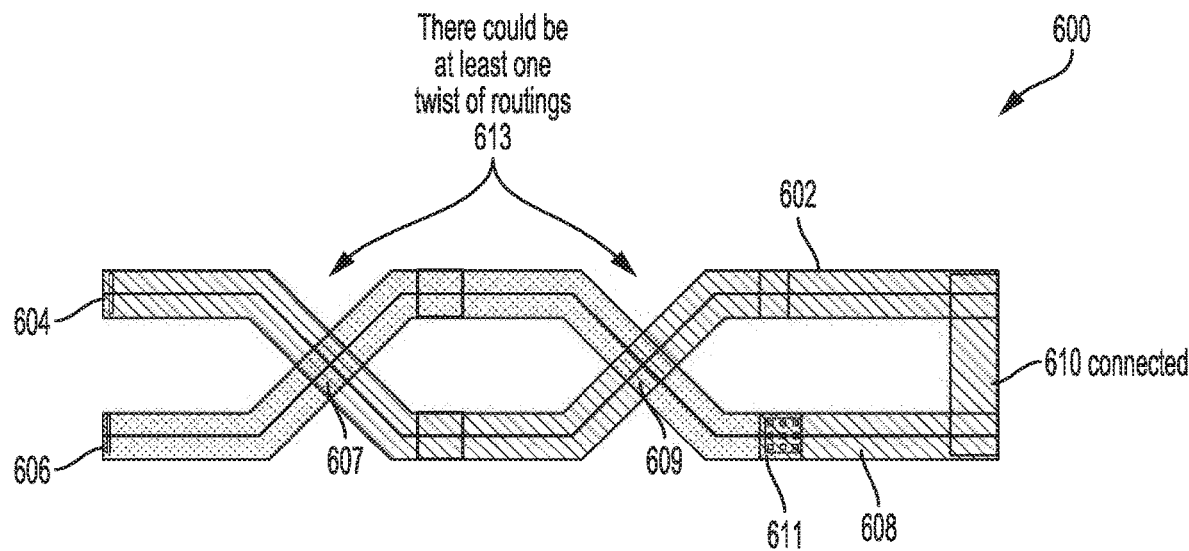
FIG. 6 illustrates a top view of a co-wound resistor having an overlapped configuration, according to aspects of the present disclosure.

FIG. 6 illustrates a top view of a co-wound resistor 600 having an overlapped configuration, according to aspects of the present disclosure. The co-wound resistor 600 includes a first resistive strip 602 having an input terminal 604, a second resistive strip 608 having an output terminal 606, and an interconnect 610 coupling the first resistive strip 602 to the second resistive strip 608. The second resistive strip 608 is co-wound with the first resistive strip 602 and has a similar shape as the first resistive strip 602 except in the regions 613 that include one or more twist/crossing or routing of the traces of the co-wound resistor 600.

For example, each of the first resistive strip 602 and the second resistive strip 608 is shaped in accordance with a twist/crossing/overlapped configuration where the first resistive strip 602 crosses the second resistive strip 608 at a first crossing point 607 and a second crossing point 609. The first resistive strip 602 and the second resistive strip 608 do not physically contact at the first crossing point 607 and the second crossing point 609. Instead, the first resistive strip 602 and the second resistive strip 608 are on different levels at the first crossing point 607 and the second crossing point 609. For example, the portion of the second resistive strip 608 between a via 611 and the output terminal 606 is on a different level than the rest of the co-wound resistor 600.

Figure 7:
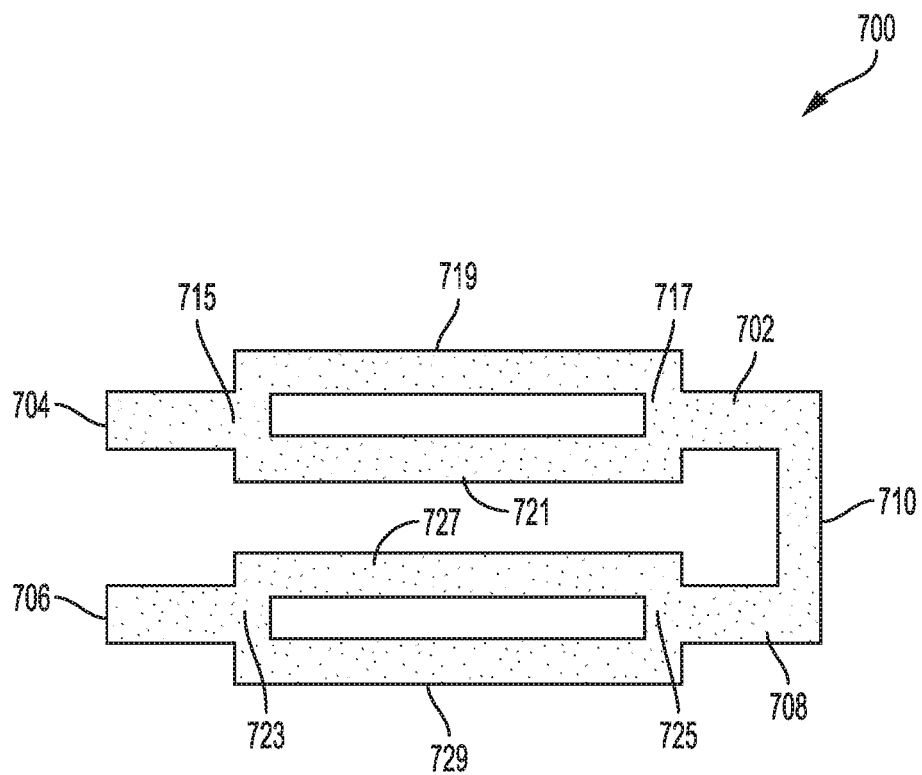
FIG. 7 illustrates a top view of a co-wound resistor having a split configuration, according to aspects of the present disclosure.

FIG. 7 illustrates a top view of a co-wound resistor 700 having a split configuration, according to aspects of the present disclosure. The co-wound resistor includes a first resistive strip 702 having an input terminal 704, a second resistive strip 708 having a first output terminal 706, and an interconnect 710 coupling the first resistive strip 702 to the second resistive strip 708. In some aspects, each of the first resistive strip 702 and the second resistive strip 708 include multiple parallel traces. For example, the first resistive strip 702 includes a first node 715 and a second node 717 where multiple traces (e.g., a first trace 719 and a second trace 721) are in parallel between the first node 715 and the second node 717. Similarly, the second resistive strip 708 includes a third node 723 and a fourth node 725 where multiple traces (e.g., a third trace 727 and a fourth trace 729) are in parallel between the third node 723 and the fourth node 725. The first resistive strip 702, the second resistive strip 708, and the interconnect 710 are at a same level.

Figure 8:
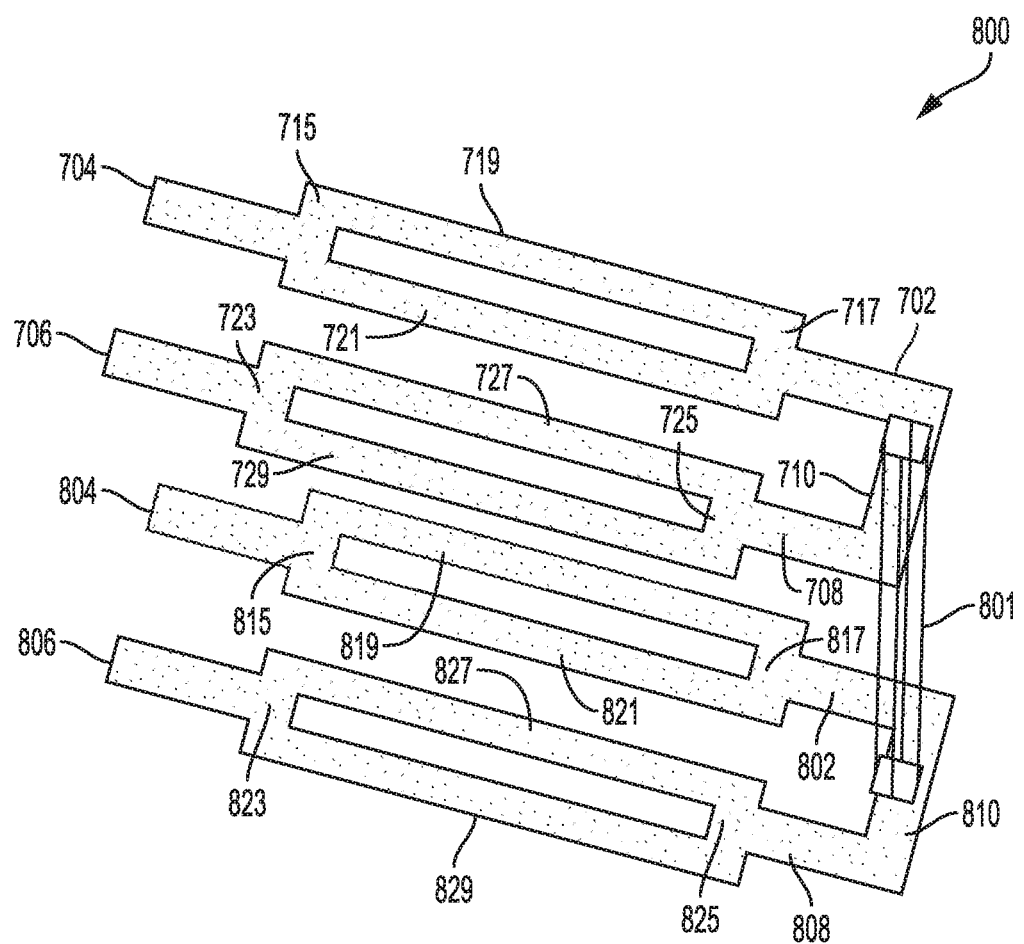
FIG. 8 illustrates multiple layers of a co-wound resistor having a split configuration, according to aspects of the present disclosure.

FIG. 8 illustrates multiple layers of a co-wound resistor 800 having a split configuration, according to aspects of the present disclosure. For illustrative purposes, some of the labelling and numbering of the devices and features of FIG. 8 are similar to those of the FIG. 7. For example, the co-wound resistor 800 includes a first resistive structure (e.g., the co-wound resistor 700) on a first level and a second resistive structure on a second level.

The second resistive structure includes a first resistive strip 802 having a second input terminal 804, a second resistive strip 808 having a second output terminal 806, and an interconnect 810 coupling the first resistive strip 802 to the second resistive strip 808. The first resistive strip 802 includes a first node 815 and a second node 817 where multiple traces (e.g., a first trace 819 and a second trace 821) are in parallel between the first node 815 and the second node 817. Similarly, the second resistive strip 808 includes a third node 823 and a fourth node 825 where multiple traces (e.g., a third trace 827 and a fourth trace 829) are in parallel between the third node 823 and the fourth node 825. The first resistive strip 802, the second resistive strip 808, and the interconnect 810 are at the second level. The first resistive structure of the co-wound resistor 800 is coupled to the second resistive structure of the co-wound resistor 800 using a via 801. For example, the interconnect 710 is coupled to the interconnect 810 using the via 801.

Figure 9:
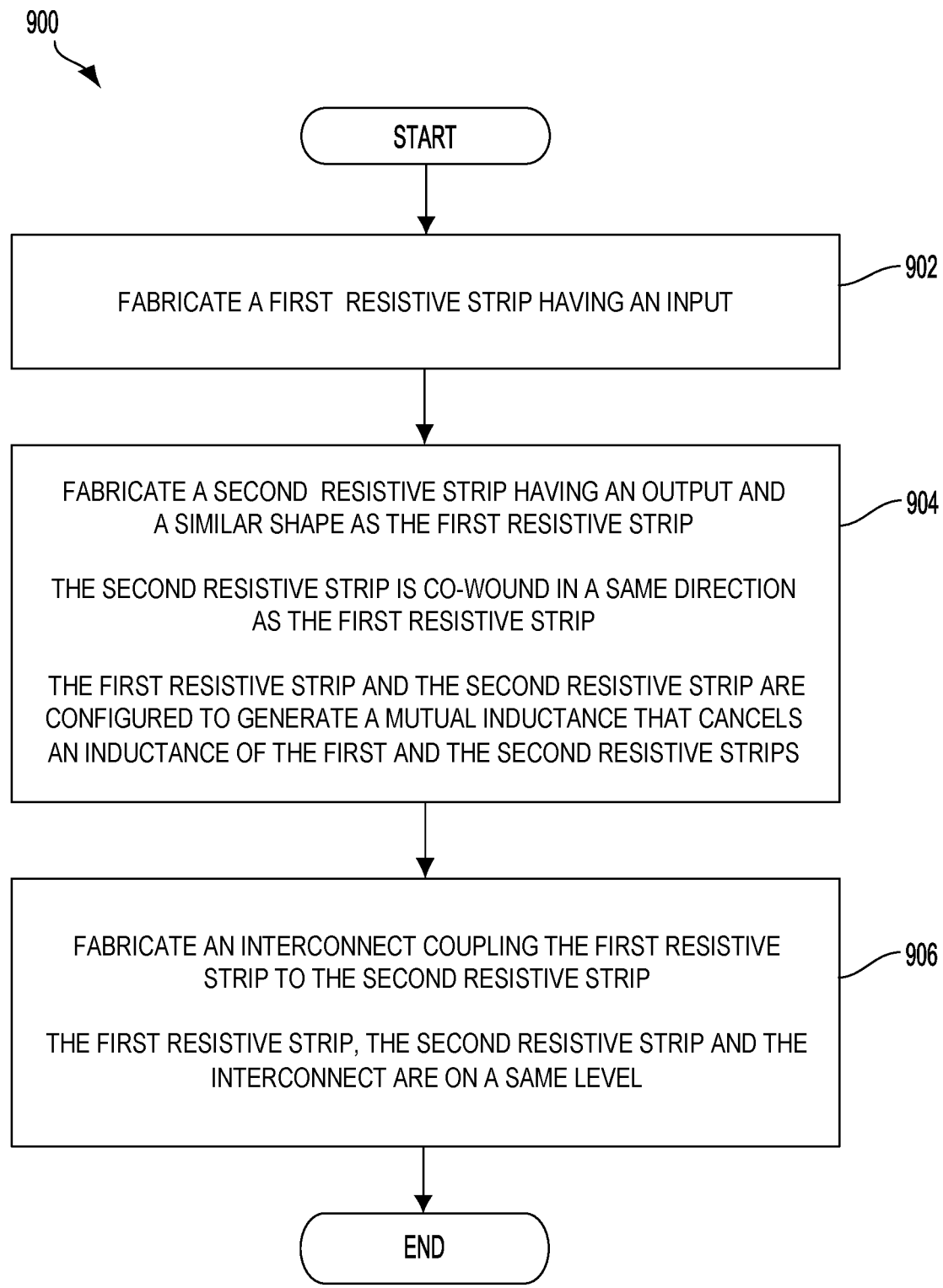
FIG. 9 illustrates a method of fabricating a co-wound resistor, according to aspects of the present disclosure.

FIG. 9 illustrates a method 900 of fabricating a co-wound resistor, according to aspects of the present disclosure. The method 900 begins at block 902, where a first resistive strip having an input (e.g., an input terminal) is fabricated. At block 904, a second resistive strip having an output (e.g., an output terminal) is fabricated. The second resistive strip is similar in shape as the first resistive strip. The second resistive strip is co-wound in a same direction as the first resistive strip. In addition, the second resistive strip and the first resistive strip are configured to generate a mutual inductance that cancels an inductance of the first and second resistive strips.

At block 906, an interconnect coupling the first resistive strip to the second resistive strip is fabricated. The first resistive strip, the second resistive strip, and the interconnect are on a same level.

According to an aspect of the present disclosure, a co-wound resistor is described. In one configuration, the co-wound resistor includes first means for generating resistance and second means for generating resistance. For example, the first means for generating resistance may be the first resistive strip 302, the third input trace 402c, the first resistive strip 502, first resistive strip 602 and/or the first resistive strip 702 as shown in FIGS. 3A, 4B, 5, 6 and 7. The second means for generating resistance may be the second resistive strip 308, the first output trace 408a, the second resistive strip 508, the second resistive strip 608 and/or the second resistive strip 708 as shown in FIGS. 3A, 4B, 5, 6 and 7. In another aspect, the aforementioned means may be any module or any apparatus or material configured to perform the functions recited by the aforementioned means.

Figure 10:
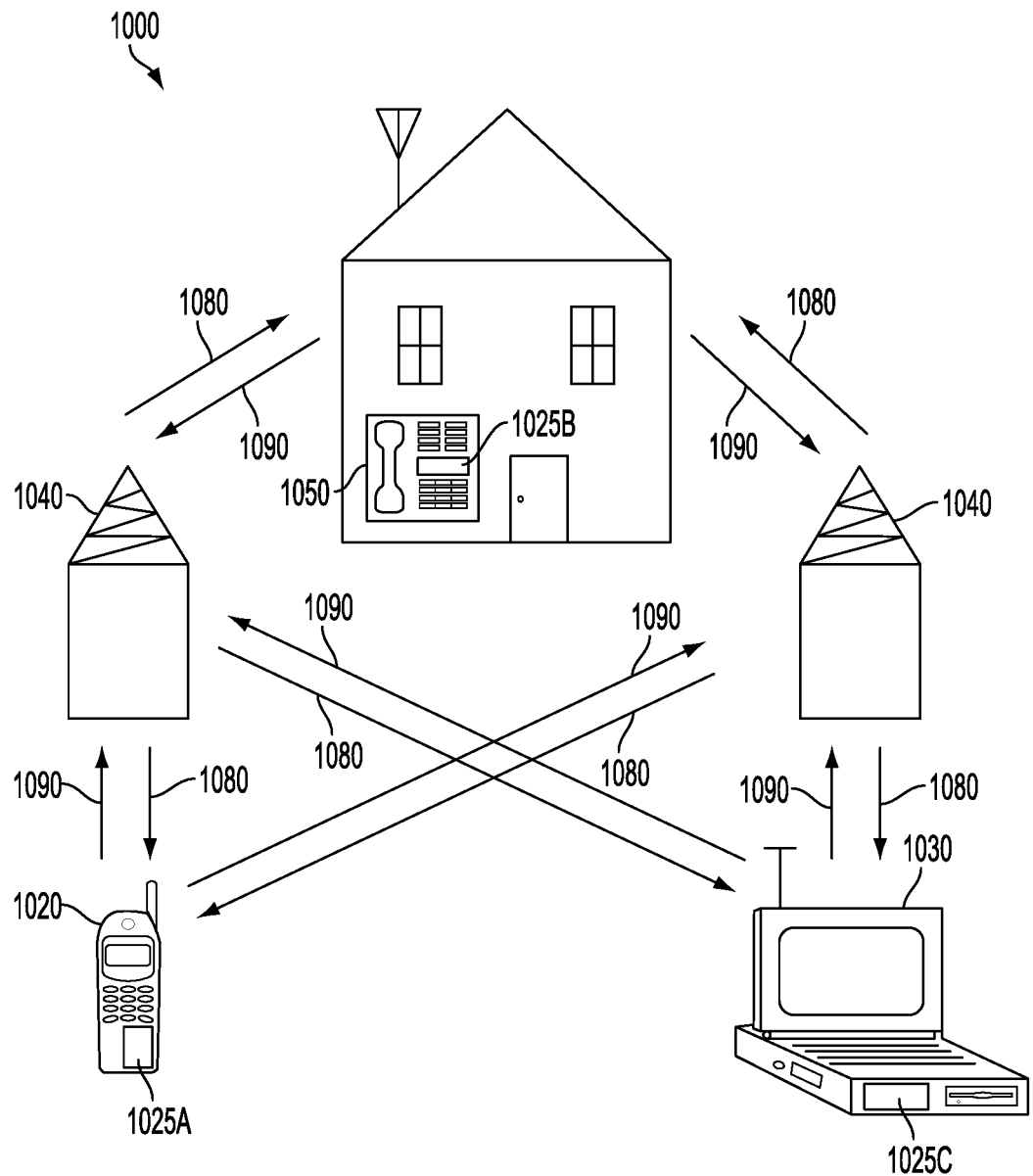
FIG. 10 is a block diagram showing an exemplary wireless communications system in which an aspect of the present disclosure may be advantageously employed.

FIG. 10 is a block diagram showing an exemplary wireless communications system 1000 in which an aspect of the present disclosure may be advantageously employed. For purposes of illustration, FIG. 10 shows three remote units 1020, 1030, and 1050 and two base stations 1040. It will be recognized that wireless communications systems may have many more remote units and base stations. Remote units 1020, 1030, and 1050 include IC devices 1025A, 1025B, and 1025C that include the disclosed co-wound resistor. It will be recognized that other devices may also include the disclosed co-wound resistor, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base station 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be a mobile phone, a hand-held personal communications systems (PCS) unit, a portable data unit such as a personal data assistant, a GPS enabled devices, a navigation device, a set top box, a music player, a video player, an entertainment unit, a fixed location data unit such as meter reading equipment, or other devices that store or retrieve data or computer instructions, or combinations thereof. Although FIG. 10 illustrates remote units according to the aspects of the present disclosure, the present disclosure is not limited to these exemplary illustrated units. Aspects of the present disclosure may be suitably employed in many devices, which include the disclosed co-wound resistor.

Figure 11:
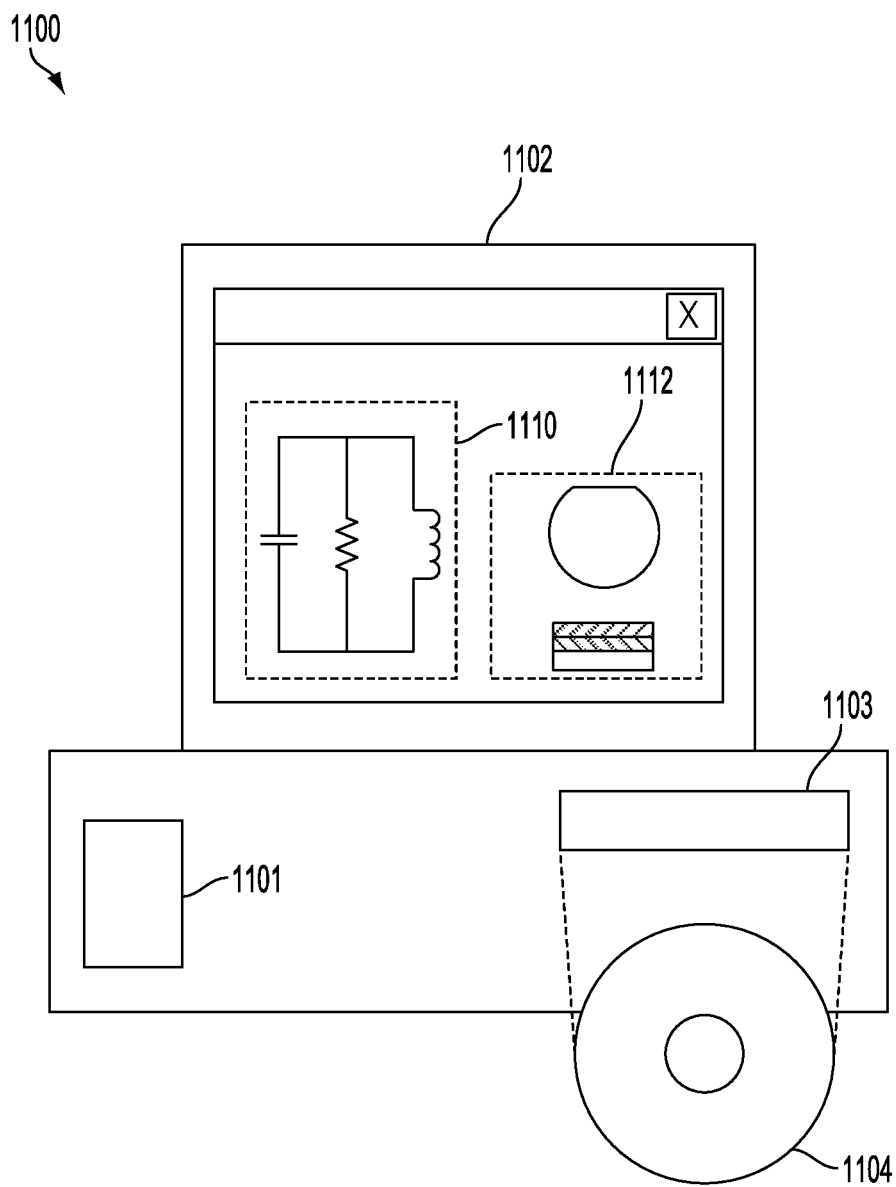
FIG. 11 is a block diagram illustrating a design workstation used for circuit, layout, and logic design of a co-wound resistor according to one configuration.

FIG. 11 is a block diagram illustrating a design workstation used for circuit, layout, and logic design of an IC structure, such as the co-wound resistor disclosed above. A design workstation 1100 includes a hard disk 1101 containing operating system software, support files, and design software such as Cadence or OrCAD. The design workstation 1100 also includes a display 1102 to facilitate design of a circuit 1110 or an IC device 1112 including the disclosed co-wound resistor. A storage medium 1104 is provided for tangibly storing the design of the circuit 1110 or the IC device 1112. The design of the circuit 1110 or the IC device 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit 1110 or the IC device 1112 including the disclosed co-wound resistor by decreasing the number of processes for designing semiconductor wafers.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on non-transitory computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the present disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communications media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description of the present disclosure is provided to enable any person skilled in the art to make or use the present disclosure. Various modifications to the present disclosure will be readily apparent to those skilled in the art, and the generic principles defined herein may be applied to other variations without departing from the spirit or scope of the present disclosure. Thus, the present disclosure is not intended to be limited to the examples and designs described herein but is to be accorded the widest scope consistent with the principles and novel features disclosed herein.

What is claimed is:

1. A co-wound resistor, comprising:
    a first resistive strip having an input;
    a second resistive strip having an output and a similar shape as the first resistive strip, the second resistive strip co-wound in a same direction as the first resistive strip, the second resistive strip and the first resistive strip configured to generate a mutual inductance that cancels an inductance of the first resistive strip and the second resistive strip; and
    a first interconnect coupling the first resistive strip to the second resistive strip, in which the first resistive strip, the second resistive strip and the first interconnect are on a same level.

2. The co-wound resistor of claim 1, in which the first resistive strip and the second resistive strip comprise polysilicon or metal.

3. The co-wound resistor of claim 1, in which each of the first resistive strip and the second resistive strip includes a plurality of parallel traces.

4. The co-wound resistor of claim 1, in which the first resistive strip comprises a first node and a second node, and multiple traces in parallel between the first node and the second node.

5. The co-wound resistor of claim 1, in which the second resistive strip comprises a third node and a fourth node, and multiple traces in parallel between the third node and the fourth node.

6. The co-wound resistor of claim 1, further comprising a third resistive strip and a fourth resistive strip connected together by a second interconnect, the third resistive strip, the fourth resistive strip and the second interconnect being on a different level than the first resistive strip and the second resistive strip, and in which a via connects the third resistive strip and the fourth resistive strip to the first resistive strip and the second resistive strip.

7. The co-wound resistor of claim 6, in which the first resistive strip and the second resistive strip comprise polysilicon and the third resistive strip and the fourth resistive strip comprise a metal.

8. The co-wound resistor of claim 6, in which each of the first resistive strip, the second resistive strip, the third resistive strip and the fourth resistive strip comprise a metal.

9. The co-wound resistor of claim 6, in which each of the first resistive strip and the second resistive strip comprise multiple layers.

10. The co-wound resistor of claim 1, in which each of the first resistive strip and the second resistive strip are shaped in a twist/crossing configuration, straight line configuration or a meandering line configuration.

11. A method of fabricating a co-wound resistor comprising:
fabricating a first resistive strip having an input;
fabricating a second resistive strip having an output and a similar shape as the first resistive strip, the second resistive strip co-wound in a same direction as the first resistive strip, the second resistive strip and the first resistive strip configured to generate a mutual inductance that cancels an inductance of the first resistive strip and the second resistive strip; and
fabricating an interconnect coupling the first resistive strip to the second resistive strip, in which the first resistive strip, the second resistive strip and the interconnect are on a same level.

12. The co-wound resistor of claim 11, in which fabricating the first resistive strip comprises fabricating a first node and a second node of the first resistive strip, and multiple traces in parallel between the first node and the second node.

13. The co-wound resistor of claim 11, in which fabricating the second resistive strip comprises fabricating a third node and a fourth node of the second resistive strip, and multiple traces in parallel between the third node and the fourth node.

14. The method of fabricating a co-wound resistor of claim 11, further comprising fabricating a third resistive strip and a fourth resistive strip connected together by a second interconnect, the third resistive strip, the fourth resistive strip and the second interconnect being on a different level than the first resistive strip and the second resistive strip, and in which a via connects the third resistive strip and the fourth resistive strip to the first resistive strip and the second resistive strip.

15. A co-wound resistor, comprising:
first means for generating resistance having an input;
second means for generating resistance having an output and a similar shape as the first resistance generating means, the second resistance generating means co-wound in a same direction as the first resistance generating means, the second resistance generating means and the first resistance generating means configured to generate a mutual inductance that cancels an inductance of the first resistance generating means and the second resistance generating means; and
a first interconnect coupling the first resistance generating means to the second resistance generating means, in which the first resistance generating means, the second resistance generating means and the first interconnect are on a same level.

16. The co-wound resistor of claim 15, in which the first resistance generating means and the second resistance generating means comprise polysilicon or metal.

17. The co-wound resistor of claim 15, in which each of the first resistance generating means and the second resistance generating means includes a plurality of parallel traces.

18. The co-wound resistor of claim 15, in which the first resistance generating means comprises a first node and a second node, and multiple traces in parallel between the first node and the second node.

19. The co-wound resistor of claim 15, in which the second resistance generating means comprises a third node and a fourth node, and multiple traces in parallel between the third node and the fourth node.

20. The co-wound resistor of claim 19, further comprising a third resistance generating means and a fourth resistance generating means connected together by a second interconnect, the third resistance generating means, the fourth resistance generating means and the second interconnect being on a different level than the first resistance generating means and the second resistance generating means, and in which a via connects the third resistance generating means and the fourth resistance generating means to the first resistance generating means and the second resistance generating means.

* * * * *